(12) United States Patent
Ortet et al.

(10) Patent No.: US 12,199,511 B2
(45) Date of Patent: Jan. 14, 2025

(54) VOLTAGE CONVERTER HAVING ADJUSTABLE PHASES

(71) Applicant: STMicroelectronics (Rousset) SAS, Rousset (FR)

(72) Inventors: Sebastien Ortet, Chateauneuf-le-Rouge (FR); Didier Davino, Pourrières (FR); Remi Collette, Meyreuil (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 177 days.

(21) Appl. No.: 17/680,022

(22) Filed: Feb. 24, 2022

(65) Prior Publication Data

US 2022/0321009 A1 Oct. 6, 2022

(30) Foreign Application Priority Data

Mar. 31, 2021 (FR) ...................................... 2103300

(51) Int. Cl.
| | |
|---|---|
| *H02M 3/158* | (2006.01) |
| *H02M 1/00* | (2007.01) |
| *H02M 1/08* | (2006.01) |
| *H02M 3/157* | (2006.01) |
| *H03K 5/24* | (2006.01) |

(52) U.S. Cl.
CPC ............. *H02M 3/158* (2013.01); *H02M 1/08* (2013.01); *H02M 3/157* (2013.01); *H03K 5/2472* (2013.01); *H02M 1/0009* (2021.05)

(58) Field of Classification Search
CPC ......... H02M 3/158; H02M 1/08; H02M 1/009
See application file for complete search history.

(56) References Cited

U.S. PATENT DOCUMENTS

| | | | | |
|---|---|---|---|---|
| 8,080,987 B1* | 12/2011 | Qiu | ....................... | H02M 3/156 323/284 |
| 2014/0328087 A1* | 11/2014 | Tang | ..................... | H02M 3/156 363/21.01 |
| 2014/0347021 A1* | 11/2014 | Mednik | ................. | H02M 3/156 323/235 |
| 2015/0028924 A1* | 1/2015 | Chao | ....................... | H03K 4/90 327/133 |

(Continued)

FOREIGN PATENT DOCUMENTS

| | | | | | |
|---|---|---|---|---|---|
| CN | 107208860 A | * | 9/2017 | ............... | B60Q 1/30 |
| CN | 109151346 A | * | 1/2019 | ........... | H04N 5/3577 |

(Continued)

OTHER PUBLICATIONS

Ye-Then Chang et al., "Online Parameter Tuning Technique for Predictive Current-Mode Control Operating in Boundary Conduction Mode," IEEE Transactions on Industrial Electronics, vol. 56, No. 8, Aug. 2009, XP11262238A, 8 pages.

*Primary Examiner* — Sisay G Tiku
(74) *Attorney, Agent, or Firm* — Slater Matsil, LLP

(57) ABSTRACT

In an embodiment, a voltage converter is configured to operate by a succession of operating cycles, each cycle comprising an energy accumulation phase and an energy restitution phase, wherein the converter is further configured to determine a duration of one of the phases by comparing a voltage ramp and a first reference voltage, and wherein a slope of the voltage ramp depends on a sign of a current in an inductor at an end of a previous operating cycle.

16 Claims, 7 Drawing Sheets

(56) References Cited

U.S. PATENT DOCUMENTS

| | | | |
|---|---|---|---|
| 2016/0276931 A1* | 9/2016 | Trichy | H02M 3/158 |
| 2017/0027031 A1* | 1/2017 | Hong | H05B 45/375 |
| 2018/0367033 A1* | 12/2018 | Kotikalapoodi | H02M 1/14 |
| 2020/0119644 A1* | 4/2020 | Ortet | H02M 3/158 |
| 2021/0028700 A1* | 1/2021 | Cuenca | H02M 3/158 |
| 2022/0038001 A1* | 2/2022 | Ortet | H02M 3/1588 |
| 2022/0038003 A1* | 2/2022 | Ortet | G01R 19/1659 |
| 2022/0247311 A1* | 8/2022 | Ortet | H02M 3/158 |
| 2022/0247318 A1* | 8/2022 | Ortet | H02M 1/0032 |
| 2022/0263406 A1* | 8/2022 | Ortet | H02M 1/0025 |
| 2022/0376622 A1* | 11/2022 | Ortet | H03K 4/50 |

FOREIGN PATENT DOCUMENTS

| | | | | |
|---|---|---|---|---|
| CN | 109618443 A | * | 4/2019 | H02M 3/157 |
| CN | 112290791 A | * | 1/2021 | H02M 3/10 |
| CN | 111435819 B | * | 11/2021 | H02M 3/1584 |
| TW | 200818676 A | * | 4/2008 | H02M 3/157 |

* cited by examiner

VOLTAGE CONVERTER HAVING ADJUSTABLE PHASES

CROSS-REFERENCE TO RELATED APPLICATIONS

This application claims the benefit of French Patent Application No. 2103300, filed on Mar. 31, 2021, which application is hereby incorporated herein by reference.

TECHNICAL FIELD

The present disclosure relates generally to electronic circuits, and more particularly to Switched Mode Power Supply (SMPS) voltage converters and their operation.

BACKGROUND

In a switched mode power supply converter, a supply voltage of the converter is chopped by switching MOS (Metal Oxide Semiconductor) transistors so as to implement phases of energy accumulation in a set (the set comprising an inductive element and a capacitive element) and phases of restitution of the energy accumulated in this set.

In a switching converter configured to be able to operate in PFM mode, i.e., Pulse Frequency Modulation, each cycle of the operation of the converter comprises an energy accumulation phase in the set followed by an energy restitution phase to the load connected to the converter. During the energy accumulation phase, the current through the inductive element increases. During the energy restitution phase, the current through the inductive element decreases. For each cycle of operation, it is desirable that the current through the inductive element is zero at the beginning of the energy accumulation phase and at the end of the energy restitution phase.

Known switching converters, particularly of the PFM type, have various drawbacks.

SUMMARY

One embodiment addresses all or some of the drawbacks of known voltage converters.

One embodiment provides for a voltage converter configured to operate by a succession of operating cycles, each cycle comprising an energy accumulation phase and an energy restitution phase, the converter being configured so that the duration of one of the phases is determined by comparing a voltage ramp and a first reference voltage, the slope of the said voltage ramp depending on the sign of the current in an inductor at the end of the previous operating cycle.

Another embodiment provides a method for controlling a voltage converter comprising a succession of operating cycles, each cycle comprising an energy accumulation phase and an energy restitution phase, the duration of one of the phases being determined by comparing a voltage ramp and a first reference voltage, the slope of the said voltage ramp depending on the sign of the current in an inductor at the end of the previous operating cycle.

According to one embodiment, the said one of the phases is the energy restitution phase.

According to one embodiment, the converter is configured to make, from one cycle to the next, the slope of the said voltage ramp greater if the current in the inductor is negative, and less important if the current in the inductor is positive.

According to one embodiment, the converter comprises first and second transistors connected in series between a first node for applying a supply voltage and a second node for applying a second reference voltage, the first and second transistors being connected to each other by a third node, the third node being connected to a fourth output node by the inductor, the fourth output node being connected to the second node for applying the second reference voltage by a first capacitor.

According to one embodiment, the converter comprises a first circuit connected to the third node configured to determine the sign of the current flowing through the inductor.

According to one embodiment, the first circuit comprises third and fourth transistors connected in series between the fifth and sixth nodes, the third and fourth transistors being connected to each other by a seventh node connected to the third node, the fifth node being connected to the first power supply node by a first resistive element, and the sixth node is connected to the second reference voltage application node by a second resistive element, the control terminal of the third transistor is connected to the second node, and the control terminal of the fourth transistor is connected to a first node, the second circuit comprising an eighth output node at which a first signal is provided taking a first value when the voltage at the third node is greater than the first supply voltage and a second value when the voltage at the third node is less than the first supply voltage and a ninth output node on which a second signal is provided having a first value when the voltage on the third node is less than the second voltage and a second value when the voltage on the third node is greater than the second voltage.

According to one embodiment, the converter comprises a second circuit configured to generate the voltage ramp, the slope of the voltage ramp being dependent on a third signal.

According to one embodiment, the second circuit comprises a capacitive circuit of variable capacitance configured to be charged upon generation of the ramp, the capacitance of the circuit being dependent on the value of the third signal.

According to one embodiment, the third signal has a finite number of possible values, each value of the signal corresponding to a capacitance value.

According to one embodiment, the converter comprises a third circuit configured to determine the change in the third signal according to the values of the first and second signals.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional, and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to a . . . as orientated during normal use.

Unless specified otherwise, the expressions "around", "approximately", "substantially" and "in the order of" signify within 10%, and preferably within 5%.

Figure 1:
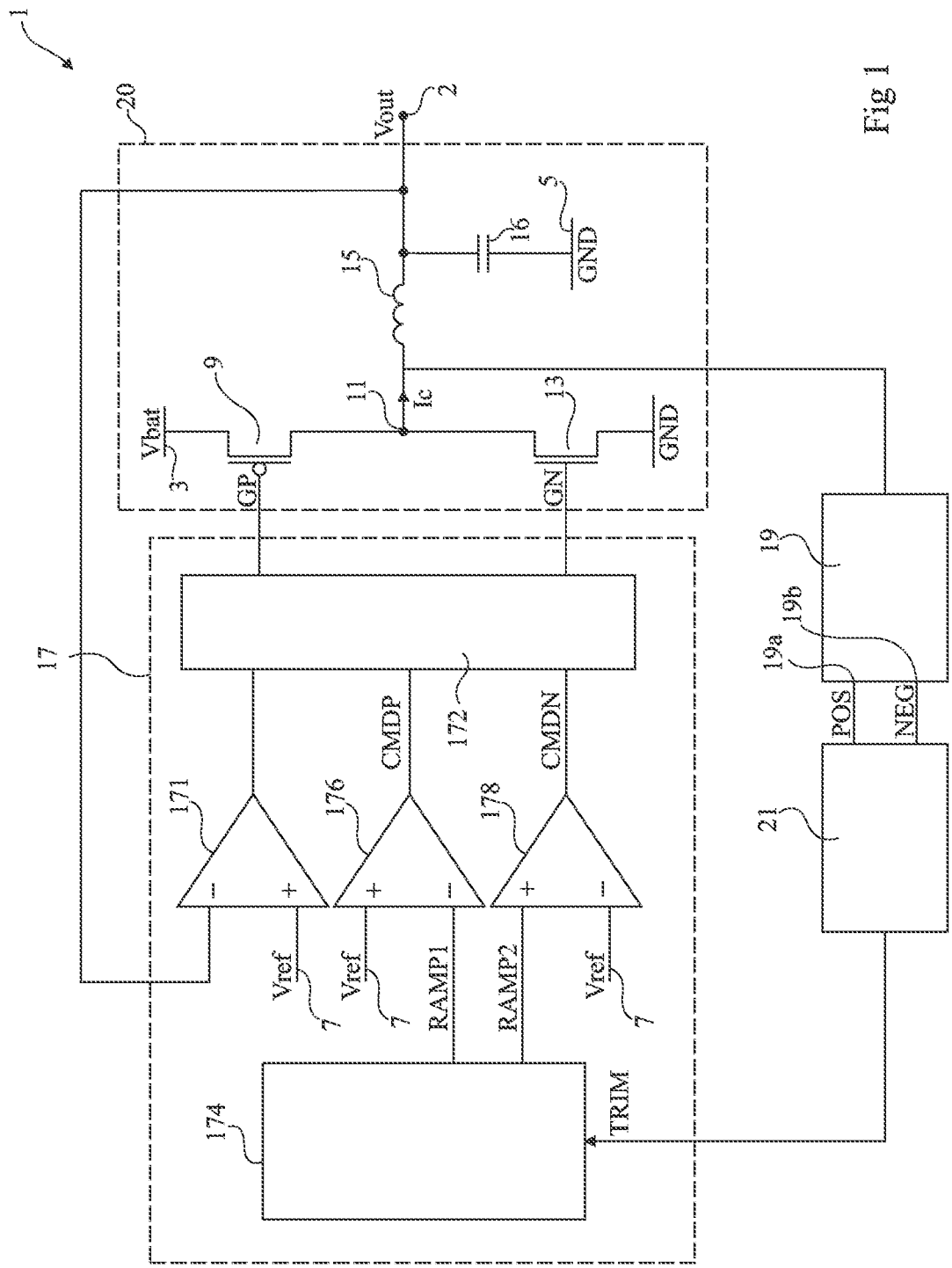
FIG. 1 represents schematically an embodiment of a voltage converter.

FIG. 1 represents schematically an embodiment of a voltage converter 1. The converter 1 is a DC/DC converter, of the switching power supply type, which converts a DC supply voltage to a DC output voltage.

The converter 1 is configured to provide a DC output voltage Vout. The converter comprises an output node 2, at which the voltage Vout is available.

The converter 1 is supplied with a DC supply voltage Vbat. The converter 1 is then connected between a first conductor rail, or node, 3 connected to the voltage Vbat, and a second conductor rail, or node, 5 connected to a reference potential GND.

The converter 1 is configured to provide the voltage Vout at a value equal to a setpoint value. For this purpose, the converter 1 receives, at an input node 7, a DC setpoint voltage Vref referenced to the potential GND, the value of which is shown to be representative of the setpoint value of the voltage Vout, preferably equal to the setpoint value of the voltage Vout. The voltage Vref is preferably substantially constant during operation of the converter.

In this example, the voltages Vout, Vbat and Vref are positive. In this example, the voltages Vout, Vbat, and Vref are referenced to the potential GND, such as ground.

In this example, the converter 1 is of the step-down or buck type, i.e., the set value of the voltage Vout is lower than the value of the voltage Vbat. In other words, the value of the voltage Vout is lower than the value of the voltage Vbat.

The converter 1 comprises a power stage 20. The power stage 20 comprises a first MOS ("metal oxide semiconductor") transistor 9, preferably a PMOS (P-channel MOS transistor). The MOS transistor 9 is coupled, preferably connected, between the rail 3 and an internal node 11. In other words, a first conduction terminal of the transistor 9, for example, its source, is coupled, preferably connected, to the rail 3, with a second conduction terminal of the transistor 9, for example, its drain, being coupled, preferably connected, to the node 11.

The stage 20 further comprises a second MOS transistor 13, preferably an NMOS (N-channel MOS transistor) transistor. The transistor 13 is coupled, preferably connected, between the node 11 and the rail 5. In other words, a first conduction terminal of the transistor 13, for example, its source, is coupled, preferably connected, to the rail 5, with a second conduction terminal of the transistor 13, for example, its drain, being coupled, preferably connected, to the node 11. Alternatively, the NMOS transistor may be replaced by a diode or a Schottky diode.

Thus, the transistors 9 and 13 are connected in series between the rails 3 and 5 and are connected to each other at the internal node 11.

Each of the transistors 9 and 13 comprises an intrinsic diode not represented. The intrinsic diodes not represented are, for example, connected in series between the rails 3 and 5. More specifically, a first terminal, anode or cathode, of the intrinsic diode of the transistor 13 is coupled, preferably connected, to rail 5 and a second terminal, cathode or anode, of the said diode is coupled, preferably connected, to the node 11. A first terminal, anode or cathode, of the intrinsic diode of the transistor 9 is coupled, preferably connected, to node 11 and a second terminal, cathode or anode, of the said diode is coupled, preferably connected, to rail 3. The first terminals of the intrinsic diodes are for example the anodes and the second terminals of the intrinsic diodes are for example the cathodes. The node 11 is thus connected to the anode of one of the diodes and to the cathode of the other diode.

The stage 20 comprises an inductive element or inductor 15. The inductor 15 is connected between the node 11 and the node 2. The converter 1 comprises an output capacitive element or capacitor 16 connected between the node 2 and the rail 5. As an example, the capacitance of the capacitor is greater than 2 µF, preferably between 2.2 µF to 20 µF or even more. This output capacitor 16 acts as a filter. In other words, this output capacitor of the converter smooths the current present on the node 2 and stores energy supplied to the node 2 by the converter.

In operation, a load not represented, is connected between the node 2 and rail 5 so as to be supplied by the voltage Vout.

The converter 1 comprises a control circuit 17. The circuit 17 is configured to implement, or control, the cycles of operation of the converter 1, so as to regulate the voltage Vout so that its value is equal to the setpoint value Vref. The circuit 17 comprises a circuit 172, for example a state machine configured to generate the control signals for the transistors 9 and 13. Thus, an output of the circuit 172 is coupled, preferably connected, to a control terminal of the transistor 9 and provides a GP signal for controlling the transistor 9. Similarly, an output of the circuit 172 is coupled, preferably connected, to a control terminal of the transistor 13 and provides a GN signal for controlling the transistor 13.

The converter 1 is for example configured to operate in pulse frequency modulation (discontinuous conduction mode). The circuit 17 is then configured to start a cycle of operation of the converter 1 when the value of the voltage Vout is lower than the setpoint value Vref and the two transistors 9 and 13 are in the off state.

For this purpose, the circuit 17 comprises, for example, a comparator 171 configured to compare the voltage Vout and the setpoint voltage Vref. The comparator 171 comprises an input, such as an inverting input, coupled, preferably connected, to the node 2. The comparator 171 comprises another input, for example, a non-inverting input, coupled, preferably connected, to the node 7. An output of the comparator 171 is coupled, preferably connected, to the circuit 172, and provides a signal representing the difference between the voltage Vref and the voltage Vout.

More particularly, at the beginning of each operating cycle, signified by the output signal of the comparator 171, the circuit 17 is configured to control the beginning of an energy accumulation phase, i.e., switching the transistor 9 to the on state, the transistor 13 being left in the off state. Energy is then accumulated in the inductor 15 and in the capacitor 16, during a first duration TPon, a current Ic flowing in the inductor 15. At the end of the duration TPon, the circuit 17 is configured to control the switching to the off state the transistor 9 and switching to the on state the transistor 13. Energy is then restituted by the inductor 15 and the capacitor 16, to the load connected at the output of the converter, during a second duration TNon, the current Ic in the inductor decreasing. At the end of the duration TNon, the circuit 17 is configured to control the switching to the off state the transistor 13.

The durations TPon and TNon are determined by comparing the voltage ramps to a reference value, for example the setpoint voltage Vref. Thus, circuit 17 comprises a voltage ramp generation circuit 174. The circuit 174 is configured to generate a voltage ramp RAMP1 and a voltage ramp RAMP2.

The voltage ramp RAMP1 is, for example, an increasing ramp, starting at a low value less than the voltage Vref. The voltage ramp RAMP2 is for example a decreasing ramp, starting at a high value, greater than the Vref value.

The circuit 17 comprises a comparator 176. The comparator 176 comprises an input, preferably a non-inverting input, coupled, preferably connected, to the node 7. The comparator 176 comprises another input, preferably an inverting input, coupled, preferably connected, to an output of circuit 174 on which the voltage ramp RAMP1 is provided. The comparator 176 comprises an output on which is provided a CMDP signal, for example a binary signal, representative of the difference between the voltage Vref and the ramp RAMP1. Specifically, the CMDP signal indicates that the ramp RAMP1 reaches the value of the voltage Vref.

The circuit 17 comprises a comparator 178. The comparator 178 comprises an input, preferably an inverting input, coupled, preferably connected, to node 7. The comparator 178 comprises another input, preferably a non-inverting input, coupled, preferably connected, to an output of circuit 174 at which the voltage ramp RAMP2 is provided. The comparator 178 comprises an output on which is provided a CMDN signal, for example a binary signal, representative of the difference between the voltage Vref and the ramp RAMP2. Specifically, the CMDN signal indicates that the ramp RAMP2 reaches the value of the voltage Vref.

Thus, during operation of the converter 1, at a start of cycle, for example determined by the comparator 171, the energy accumulation phase begins and the ramp RAMP1 begins to increase from the low value. When the ramp RAMP1 reaches the value Vref, the CMDP signal changes from a first value to a second value, indicating the end of the energy accumulation phase. Thus, the duration TPon corresponds to the duration of the increase of the ramp RAMP1 between the low value and the value Vref. At the end of the energy accumulation phase, the energy restitution phase begins, i.e. the states of the transistors are reversed, with the transistor 9 switching to an off state and the transistor 13 switching to an on state. Moreover, the ramp RAMP2 starts to decrease from the high value. When the ramp RAMP2 reaches the value Vref, the CMDN signal changes from a first value to a second value, indicating the end of the energy restitution phase. Thus, the duration TNo corresponds to the duration of the decrease of the ramp RAMP2 between the high value and the value Vref. The end of the energy restitution phase corresponds to the end of the cycle. The transistors 9 and 13 are then switched to an off state and the node 11 is in a high impedance state until the voltage Vout drops below the value of the voltage Vref again.

The circuit 174 is configured to allow the slope of at least one of the voltage ramps, for example the ramp RAMP2, to be changed or adjusted. In this way, the duration of at least one of the phases, for example the energy restitution phase, can be changed. The circuit 174 is configured so that the slope of at least one of the voltage ramps, for example the ramp RAMP2, is varied so as to achieve a zero current in the inductor at the end of the operating cycles.

The converter 1 comprises a circuit 19 configured to determine whether the current through the inductor 15 is positive or negative. In particular, the circuit 19 is configured to determine the sign, positive or negative, of the current through the inductor 15 at the end of each operating cycle, i.e., at the end of each energy restitution phase.

In the embodiment of FIG. 1, the circuit 19 comprises an input coupled, preferably connected, to the node 11. The circuit 19 comprises, for example, an output 19a on which is provided a POS signal indicating that the current in the inductor 15 is positive and an input 19b on which is provided a NEG signal indicating that the current in the inductor 15 is negative.

The converter 1 further comprises a circuit 21 configured to determine, from the POS and NEG signals, the change to be made in the slope(s) of the voltage ramps. The circuit 21 comprises two inputs, one input coupled, preferably connected, to the output 19a of the circuit 19 on which the POS signal is received and one input coupled, preferably connected, to the output 19b of the circuit 19 on which the NEG signal is provided. The circuit 21 comprises an output on which is provided a TRIM signal representing the changes to be made on at least one voltage ramp slope. The output of circuit 21 is coupled, preferably connected, to an input of the circuit 174.

According to one embodiment, the voltage ramp slope RAMP1 is not changed from one cycle to the next. Thus, the slope of the voltage ramp RAMP1 is substantially constant from one cycle to the next. The slope of the ramp RAMP2 can be modified from one cycle to the next, according to the sign of the current flowing through the inductor 15 at the end of the cycle. For example, the circuit 174 is configured for a finite number of ramp RAMP2 slope values. The ramp RAMP2 may be generated by the circuit 174 with a slope having one of N separate possible slope values. The different possible slopes range from, for example, a slope value V1 to a slope value VN, with the V1 value being, for example, the least sloping and the VN value being, for example, the most sloping.

For example, if the current in the inductor 15 is positive at the end of a cycle, not all of the energy has been restituted. The slope of the ramp RAMP2 is therefore, in the next cycle, modified so as to be less steep, i.e., to have a smaller inclination. For example, it passes from a value Vi of slope, to a value Vi−1. In other words, the slope is decreased to the nearest lower value. The energy restitution phase is thus longer.

Similarly, if the current in inductor 15 is negative at the end of a cycle, too much energy has been restituted. The slope of the ramp RAMP2 is therefore, in the next cycle, modified so as to be steeper, i.e., to have a greater inclination. For example, it passes from a value Vi, of the slope, to a value Vi+1. In other words, the slope is increased to the nearest higher value. This results in a shorter energy accumulation phase.

Preferably, when the converter starts, the value of the slope has a central, or median, value, i.e., there are as many lower values as there are higher values. Preferably, this central value is equal to or substantially equal to the value of the slope of the ramp RAMP1.

According to another embodiment, the slope of the ramp RAMP2 is not changed from one cycle to the next, and the slope of the ramp RAMP1 is changed from one cycle to the next. The operation is then similar to the operation described above, except that the slope of the ramp RAMP1 becomes steeper if the current in the inductor 15 is positive and becomes lower if the current in inductor 15 is negative at the end of the cycle.

Figure 2:
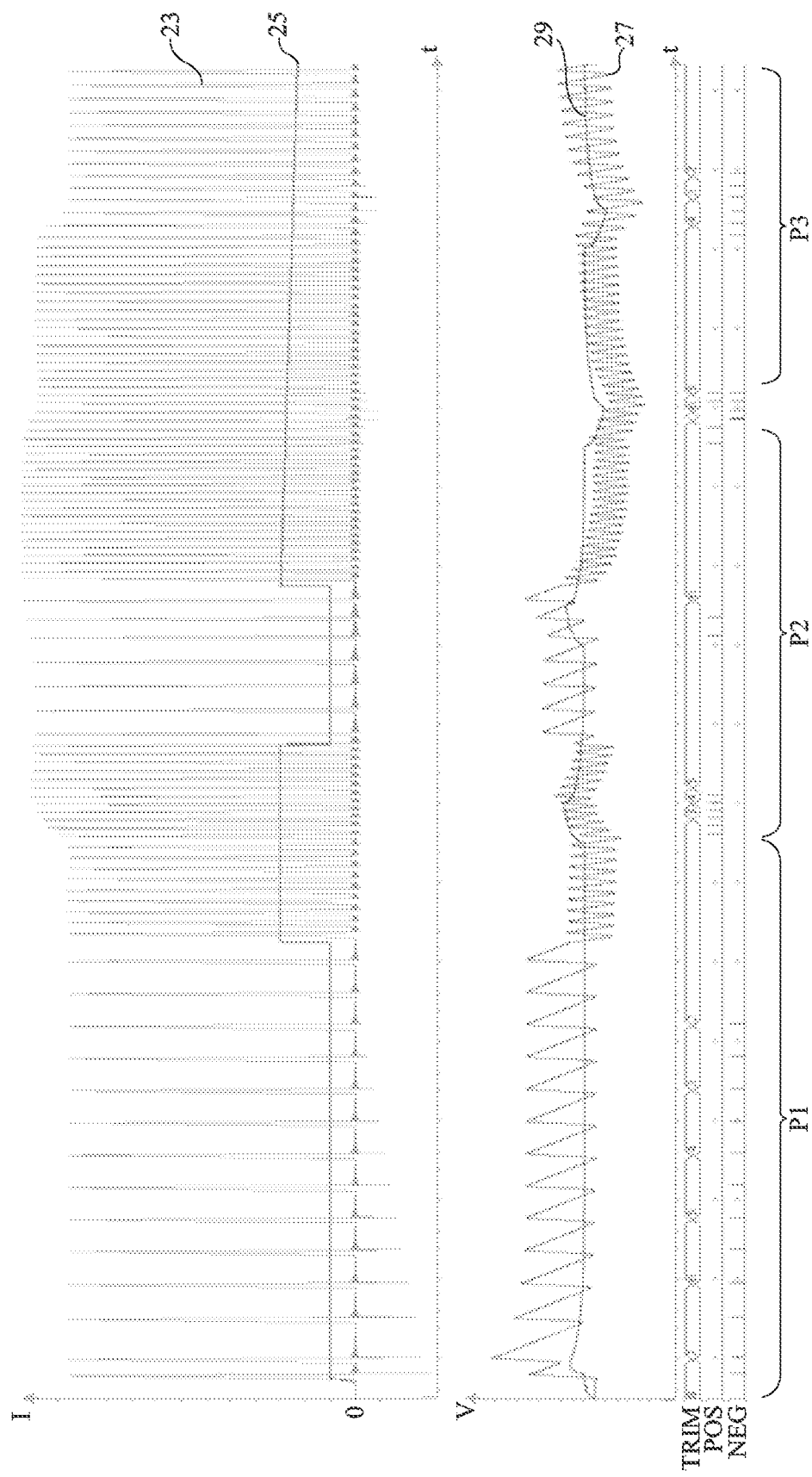
FIG. 2 shows a set of timing diagrams illustrating the operation of the circuit of FIG. 1.

FIG. 2 is a set of timing diagrams illustrating the operation of the circuit of FIG. 1. FIG. 2 comprises a timing diagram illustrating current (I) versus time (t). More specifically, the timing diagram illustrates the current Ic in the inductor 15 by a curve 23 and illustrates the current drawn by the unrepresented load by a curve 25. FIG. 2 further comprises a timing diagram illustrating voltage (V) versus time (t). More specifically, the timing diagram illustrates the output voltage Vout by a curve 27 and the setpoint voltage Vref by a curve 29. FIG. 2 further comprises timing diagrams illustrating the TRIM, POS and NEG signals.

The values of the TRIM signal are, in this example, related to slope values. Thus, if the TRIM signal has a value of 8, the slope has a value of V8.

It can be observed that at the end of each operating cycle, which corresponds to a minimum of the curve 29, a pulse, i.e. a switching of the signal to the high value for a duration of a few nanoseconds, occurs on the POS signal if the current Ic is positive and a pulse occurs on the NEG signal if the signal Ic is negative.

In the example of FIG. 2, the value of the TRIM signal is modified if two successive pulses occur on the NEG signal, or on the POS signal. More generally, the value of the TRIM signal can be modified at each cycle, or every N cycles, where N is an integer, for example, at least equal to 2.

Thus, in a phase P1, the current Ic is less than 0 at the end of the operating cycles, which leads to the formation of a pulse on the NEG signal. For every two pulses of the NEG signal, in the example of FIG. 2, the value of the TRIM signal decreases by a constant value, for example the step of a counter, for example 1. It can then be observed that the maximum negative value of the current Ic at the end of the cycle approaches 0 during phase P1 with the changes in the value of TRIM and thus the change in the slope of the ramp RAMP2. Thus, at the end of the phase P1, the value of the current Ic at the end of the cycle is substantially equal to 0.

Similarly, in a phase P2, subsequent to phase P1, the current Ic is greater than 0 at the end of the operating cycles, which leads to the formation of a pulse on the POS signal. The transition from phase P1 to phase P2 is caused, for example, by an increase in the current drawn by the load, illustrated by the curve 25. This increase is caused, for example, by a change in the supply voltage. For every second pulse of the POS signal, the value of the TRIM signal increases by a constant value, for example 1. It can then be observed that the positive value of the current Ic at the end of the cycle decreases during the phase P1 with the changes in the TRIM value and thus the change in the slope of the ramp RAMP2.

FIG. 2 shows a phase P3 similar to phase P1.

Figure 3:
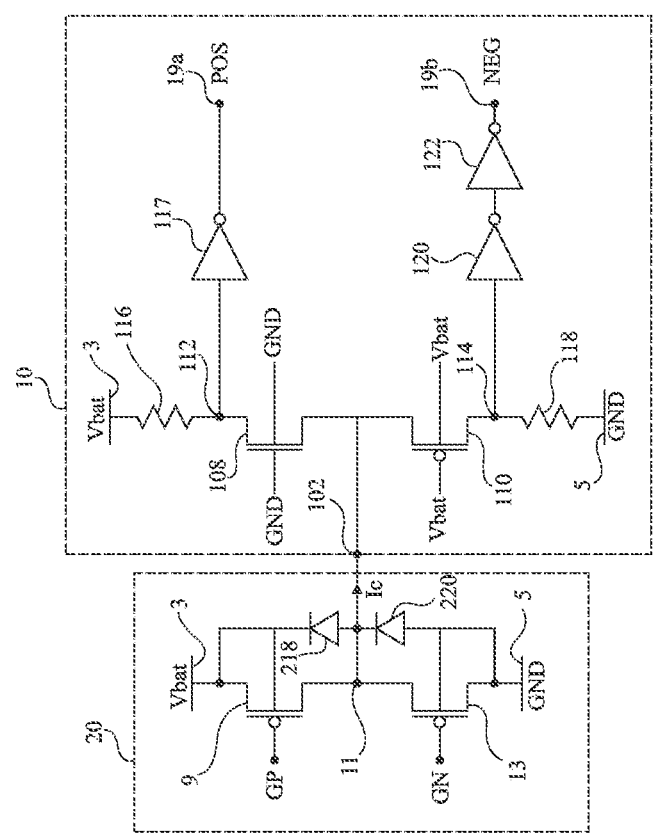
FIG. 3 represents in more detail a portion of the embodiment of FIG. 1.

FIG. 3 represents in greater detail an example implementation of a portion of the embodiment of FIG. 1. Specifically, FIG. 3 represents the circuits 19 and 20 in greater detail. The circuit 19 is configured to determine whether an input voltage is within a range of voltages. In other words, circuit 19 is configured to compare the said input voltage to first and second voltage thresholds, different from each other.

The circuit 20 is identical to circuit 20 represented in FIG. 1, except that circuit 20 comprises, in FIG. 3, two diodes 218 and 220 that were not represented in FIG. 1. The diodes 218 and 220 are connected in series between rail 3 and rail 5. Specifically, a first terminal, anode or cathode, of diode 220 is coupled, preferably connected, to the rail 5 and a second terminal, cathode or anode, of diode 220 is coupled, preferably connected, to the node 11. A first terminal, anode or cathode, of the diode 218 is coupled, preferably connected, to the node 11 and a second terminal, cathode or anode, of the diode 218 is coupled, preferably connected, to the rail 3. In the example of FIG. 3, the first terminals of the diodes 218 and 220 are anodes and the second terminals of the diodes 218 and 220 are cathodes. Thus, the node 11 is connected to the anode of one of the diodes and to the cathode of the other diode.

In other words, each diode is coupled, preferably connected, in parallel with one of the transistors 9 and 13. For example, the anode of the diode 218 is coupled, preferably connected, to the source of the transistor 9 and the cathode of the diode 218 is coupled, preferably connected, to the drain of the transistor 9. Similarly, the anode of the diode 220 is coupled, preferably connected, to the source of transistor 13 and the cathode of the diode 220 is coupled, preferably connected, to the drain of the transistor 13. For example, the cathode of the diode 218 is also coupled, preferably connected, to the substrate of the transistor 9. The anode of the diode 220 is also, for example, coupled, preferably connected, to the substrate of the transistor 13. Preferably, the diodes 218 and 220 are the intrinsic diodes of the transistors 9 and 13, respectively.

The circuit 10 comprises an input 102 coupled, preferably connected, to the node 11 and the two outputs 19a and 19b. The input 102 receives a voltage VLX, which is desired to be compared to the voltage range, and more specifically, desired to be compared to the first and second voltage thresholds. In the example of FIG. 3, the first and second thresholds are respectively the positive supply voltage Vbat of the converter 1 and a reference voltage GND, preferably ground. The output 19a provides a POS signal, preferably binary, and the output 19b provides a NEG signal, preferably binary. When the circuit 10 determines that the input voltage is greater than, for example by a value substantially equal to a diode threshold, the first threshold Vbat of the range, the NEG signal takes a first value, for example a high value. If the input voltage is less than the first threshold Vbat, the NEG voltage takes on a second value, for example, a low value. When the circuit 10 determines that the input voltage is less than, for example by a value substantially equal to a diode threshold, the second threshold of the range, the POS signal takes a first value, for example a high value. If the input voltage is greater than the second threshold, the POS voltage takes on a second value, for example a low value.

Thus, if both the POS and NEG signals have a low value, it means that the input voltage is between the first and second thresholds. If the NEG signal has a high value and the POS signal has a low value, the input voltage has a value greater than the first threshold. If the NEG signal has a low value and the POS signal has a high value, the input voltage has a value less than the second threshold.

The circuit 10 comprises two transistors 108 and no connected in series between the rails 3 and 5. More specifically, one of the conduction terminals, source or drain, of the transistor 108 is coupled, preferably connected, to a node 112. The other conduction terminal of the transistor 108, drain or source, is coupled, preferably connected, to the input node 102. One conduction terminal of the transistor no, source or drain, is coupled, preferably connected, to the node 102. The other conduction terminal of transistor no, drain or source, is coupled, preferably connected, to a node 114.

Preferably, the transistor no is a P-type, or PMOS field effect transistor, and the transistor 108 is an N-type, or NMOS field effect transistor. Preferably, transistors 108 and no are coupled, preferably connected, to the node 102 through their respective sources.

The transistor 108 is controlled by a voltage whose value is substantially equal to, preferably equal to, the second voltage threshold, here the reference voltage GND. In other words, the control terminal, or gate, of the transistor 108 is connected to the rail 5 for applying the voltage GND. The transistor no is controlled by a voltage whose value is substantially equal, preferably equal, to the first voltage threshold, here the supply voltage Vbat. In other words, the control terminal, or gate, of the transistor no is connected to the voltage Vbat application rail 3.

The node 112 is connected to the rail 3, preferably through a resistive element, or resistor, 116. The node 112 is also connected to the output node 19a, preferably by a circuit, or inverter, 117 configured to invert the binary signals. Thus, when the circuit 117 receives a low value at the input, it provides a high value at the output and vice versa.

The node 114 is connected to rail 5, preferably by a resistive element, or resistor, 118. The node 114 is also connected to the output node 19b, preferably by two circuits, or inverters, 120 and 122 in series configured to invert the binary signals.

The resistor 116, transistor 108, transistor no, and resistor 118 are thus connected in series in this order between the rails 3 and 5.

The circuits 117, 120 and 122 ensure that the POS and NEG signals are binary signals with recognizable high and low values.

Figure 4:
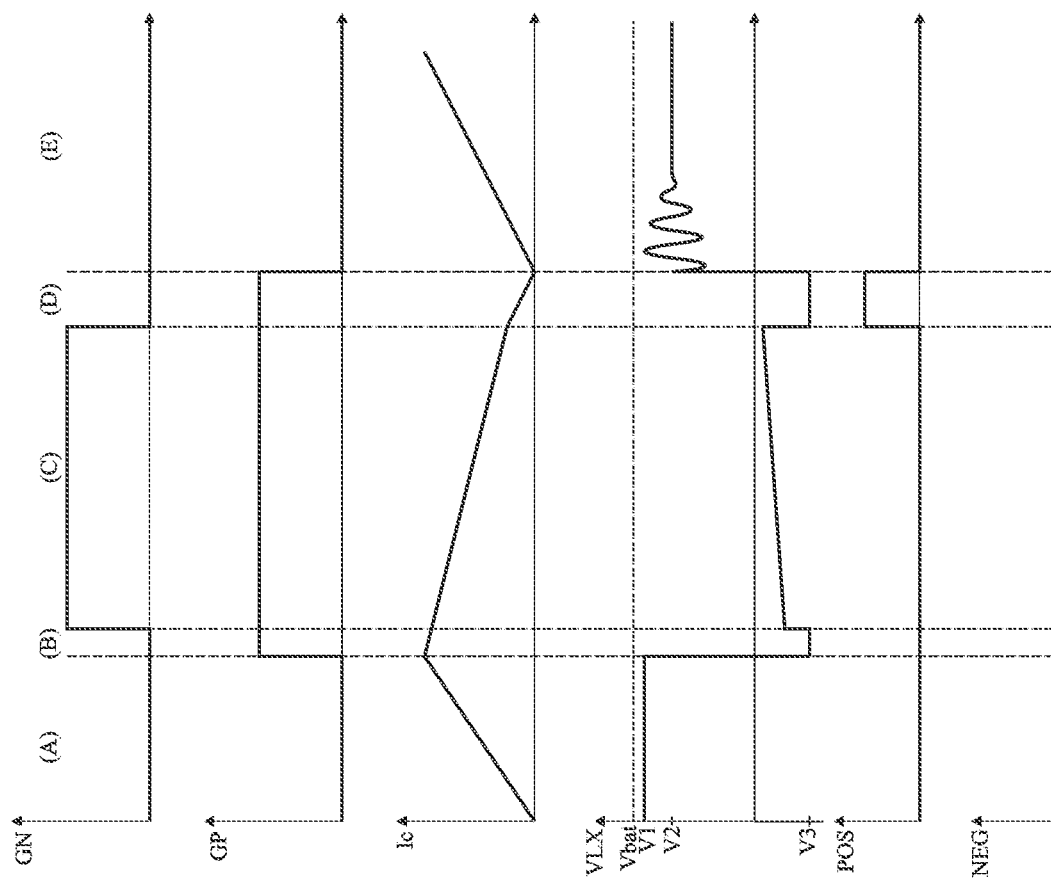
FIG. 4 is a set of timing diagrams illustrating the operation of the circuit of FIG. 3.

FIG. 4 is a set of timing diagrams illustrating the operation of the circuit in FIG. 3. Specifically, FIG. 4 represents the behavior of the control signals GN, GP, of the current Ic, the voltage VLX on node 11, and the POS and NEG signals, during one cycle of the operation of the circuit 20 of FIG. 1 and during a portion (E) of a subsequent cycle. The cycle of operation includes, for example, four phases: an energy accumulation phase (A) in the inductor 15, not shown in FIG. 4, an intermediate phase (B), an energy restitution phase (C), and a compensation phase (D).

During the energy accumulation phase (A), transistor 9 is in an on state and transistor 13 is in an off state. This corresponds, in the embodiment of FIG. 1, to the control signal GN having a low value and the control signal GP having a low value. The voltage VLX thus has a positive value V1, less than the value Vbat. Thus, during the phase (A), the current Ic through the inductor, not shown in FIG. 1, increases.

Since the voltage VLX is lower than the control voltage of transistor no, i.e., the supply voltage Vbat, the gate-source voltage of transistor no is positive. The transistor no thus remains in an off state during the phase (A). Thus, the voltage on the node 114 has a low value, for example substantially equal to the reference voltage GND. The NEG signal, at the output of inverters 120 and 122 thus has a low value.

Similarly, the voltage VLX is higher than the control voltage of the transistor 108, i.e. the reference voltage GND, the gate-source voltage of the transistor 108 is negative. The transistor 108 therefore remains in an off state during phase (A). Thus, the voltage on the node 112 has a high value, for example substantially equal to the voltage Vbat. The POS signal, at the output of the inverter 117, therefore has a low value.

During the phase (B), the transistors 13 and 9 are in an off state. This corresponds, in the embodiment of FIG. 1, to the control signal GN having a low value and the control signal GP having a high value. The phase (B) is an intermediate phase to ensure that the transistors 9 and 13 are not simultaneously switched to an on state. During the phase (B), the node 11 is no longer supplied by rail 3. The current Ic therefore decreases. The current Ic is positive and transistors 9 and 13 are in an off state. The current IC flows through the diode 220. The voltage VLX takes a negative value V3.

Since the voltage VLX is lower than the control voltage of transistor no, i.e. the supply voltage Vbat, the gate-source voltage of transistor no is positive. The transistor no thus remains in an off state during the phase (B). Thus, the voltage on the node 114 is a low value, for example substantially equal to the reference voltage GND. The NEG signal, at the output of inverters 120 and 122 thus has a low value.

The voltage VLX is negative. In other words, the voltage VLX is lower than the control voltage of the transistor 108, i.e., the reference voltage GND. Therefore, the gate-to-source voltage of transistor 108 is positive. The transistor 108 is therefore in an on state during the phase (B). Thus, the voltage on the node 112 has a low value, for example substantially equal to the voltage V3. The POS signal, at the output of the inverter 117, is however maintained at the low value. Preferably, the POS signal and the NEG signal are maintained at the low value until the end of the energy restitution phase, for example until a falling edge of the GN signal. For example, the holding of the NEG and POS signals at the low value during the phases A, B and C is performed by elements not represented. For example, holding the NEG and POS signals at a low value during the phases A, B and C is performed by the circuit 21.

During the phase (C), i.e. the energy restitution phase, the transistor 13 is in an on state and the transistor 9 is in an off state. This corresponds, in the embodiment of FIG. 3, to the control signal GN having a high value and the control signal GP having a high value. The voltage VLX increases but remains negative. During the phase (C), the current Ic decreases, as the node 11 is no longer supplied by the rail 3.

Since the voltage VLX is lower than the control voltage of transistor no, i.e. the supply voltage Vbat, the gate-source voltage of transistor no is positive. The transistor no thus remains in an off state during the phase (C). Thus, the voltage on the node 114 has a low value, for example substantially equal to the reference voltage GND. The NEG signal at the output of the inverters 120 and 122 therefore has a low value.

The voltage VLX is negative. In other words, the voltage VLX is lower than the control voltage of the transistor 108, i.e., the reference voltage GND. The gate-to-source voltage of the transistor 108 is therefore positive. The transistor 108 is therefore in an on state during the phase (B). Thus, the voltage on the node 112 has a low value, for example substantially equal to the voltage V3. The POS signal, at the output of the inverter 117, is however maintained at the low value during the phase (C).

During the phase (D), the transistor 13 is switched to an off state and the transistor 9 is switched to an off state. This corresponds, in the embodiment of FIG. 1, to the control signal GN having a low value and the control signal GP having a high value.

As in the phase (B), the current Ic is positive and the transistors 9 and 13 are in an off state. The current Ic therefore flows through the diode 220. The voltage VLX takes the negative value V3.

The voltage VLX being, as in the phase (B), lower than the control voltage of the transistor no, i.e. the supply voltage Vbat, the gate-source voltage of the transistor no is positive. The transistor no thus remains in an off state during the phase (B). Thus, the voltage on the node 114 has a low value, for example substantially equal to the reference voltage GND. The NEG signal, at the output of the inverters 120 and 122 thus has a low value.

As in the phase (B), the voltage VLX is negative. In other words, the voltage VLX is lower than the control voltage of the transistor 108, i.e., the reference voltage GND. The gate-to-source voltage of the transistor 108 is therefore positive. The transistor 108 is therefore in an on state during the phase (B). Thus, the voltage on the node 112 has a low value, for example substantially equal to the voltage V3. The POS signal, at the output of the inverter 117, is however maintained at the low value, for example until the falling edge of the GN signal.

During the phase (D), the current Ic continues to decrease. The phase (D) ends when the current Ic reaches the value zero. During the phase (D), the POS and NEG signals are no longer held at the low value. Thus, the POS signal takes the high value. The NEG signal still has the low value.

The phase (D) is followed by a phase (E) corresponding to, for example, the phase (A) of a subsequent operating cycle or a phase at standstill.

Figure 5:
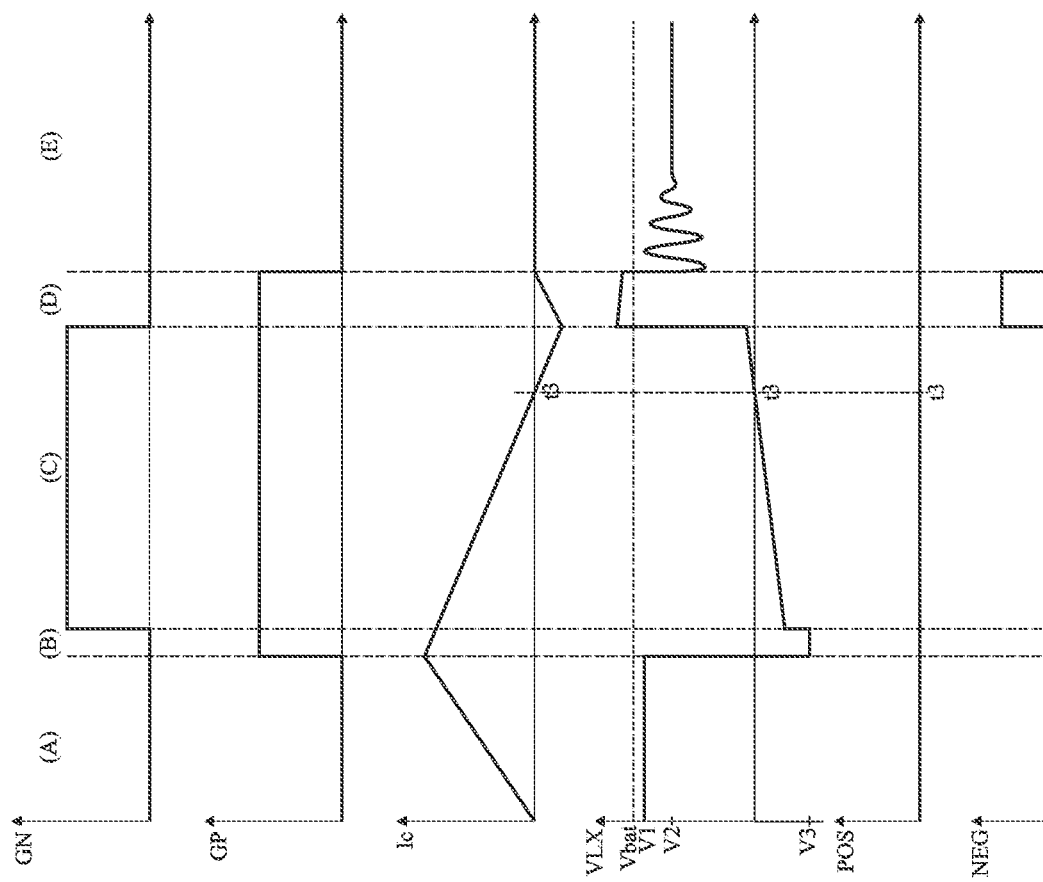
FIG. 5 is a set of timing diagrams illustrating the operation of the circuit of FIG. 3.

FIG. 5 is a set of timing diagrams illustrating the operation of the circuit of FIG. 3. More specifically, FIG. 5 represents the behavior of the control signals GN, GP, the current Ic, the voltage VLX on the node 206, and the POS and NEG signals, during an operating cycle of the circuit 20 of FIG. 1. The operating cycle includes, as in FIG. 2, four phases: a phase (A) of energy accumulation in the inductive element, an intermediate phase (B), an energy restitution phase (C), and a compensation phase (D).

The phases (A) and (B) are identical to phases (A) and (B) in FIG. 4 and will not be described again.

During the energy restitution phase (C), the transistor 13 is in an on state and transistor 9 is in an off state. This corresponds, in the embodiment of FIG. 1, to the control signal GN having a high value and the control signal GP having a high value.

The voltage VLX increases during the phase (C). At an instant tz of phase (C), the voltage VLX reaches the value zero, and then continues to increase. The current Ic decreases during the phase (C). At the instant tz, the current Ic reaches the value zero. During phase (C), the current Ic is positive before instant tz and negative after instant tz and the voltage VLX is negative before instant tz, and positive after instant tz.

During the phase (C), the voltage VLX is lower than the first voltage threshold Vbat. Thus, the NEG signal maintains the low value. In addition, the voltage VLX is lower than the second voltage threshold GND before instant tz, and above the second threshold after instant tz. During the phase (C), the POS signal is kept low.

During the phase (D), the transistor 13 is in an off state and the transistor 9 is in an off state. This corresponds, in the embodiment of FIG. 3, to the control signal GN having a low value and the control signal GP having a high value.

With transistors 9 and 13 being in an off state, and with the current Ic negative, the diode 218 becomes active. The voltage VLX thus becomes higher than the voltage Vbat, for example substantially equal to the voltage Vbat plus the threshold voltage of the diode 218. Thus, the current Ic increases until it reaches zero. When the current reaches zero, the phase (D) is complete.

Since the voltage VLX is higher, for example by a value substantially equal to a diode threshold, than the control voltage of the transistor no, i.e., the supply voltage Vbat, the NEG signal has a high value. In addition, the voltage VLX is higher than the control voltage of the transistor 108, i.e. the reference voltage GND, the POS signal has a low value.

The phase (D) is followed by a phase (E), in which the device behaves similarly to its behavior in the phase (A). Alternatively, the phase (E) corresponds to a phase at standstill.

Figure 6:
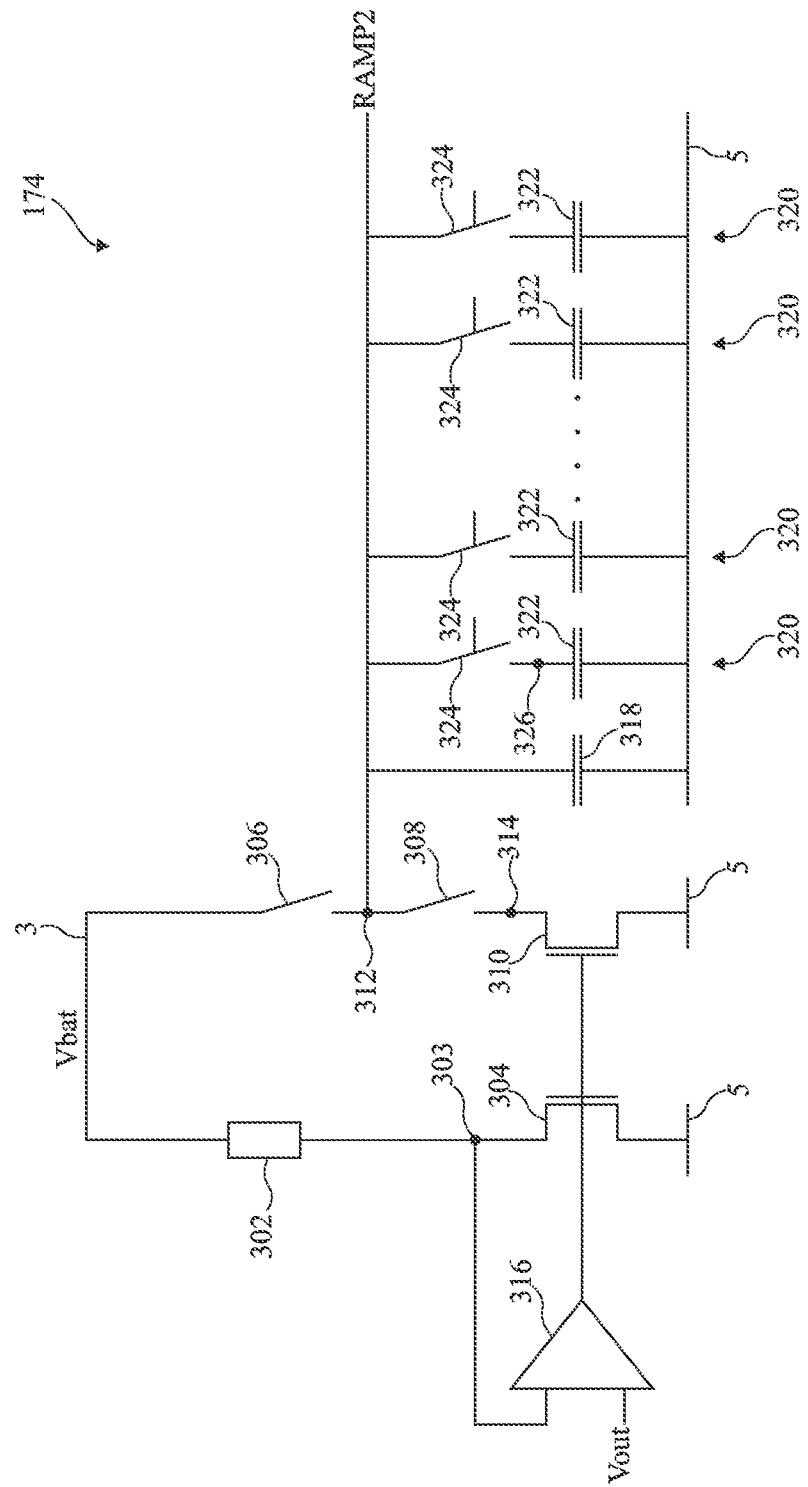
FIG. 6 represents in more detail another part of the embodiment of FIG. 1.

FIG. 6 represents in greater detail another part of the embodiment of FIG. 1. FIG. 6 represents in greater detail a portion of the voltage ramp generation circuit 174. More specifically, FIG. 6 represents the portion of the circuit 174 generating the voltage ramp whose slope depends on the TRIM signal, i.e., the ramp RAMP2 in the example whose operation is described in relation to FIG. 1.

The circuit 174 comprises a resistor 302 and a transistor 304 connected in series between the node 3 for applying the supply voltage Vbat and the node 5 for applying a reference voltage GND. More specifically, one terminal of the resistor 302 is coupled, preferably connected, to the node 3 and another terminal of the resistor 302 is coupled, preferably connected, to a node 303. One conduction terminal, for example, the drain, of transistor 304 is coupled, preferably connected, to the node 303 and another conduction terminal, for example, the source of the transistor 304 is coupled, preferably connected, to the node 5.

The circuit 174 further comprises the switches 306 and 308 in series with a transistor 310. More specifically, one terminal of the switch 306 is coupled, preferably connected, to the node 3 and another terminal of the switch 306 is coupled, preferably connected, to a node 312. One terminal of the switch 308 is coupled, preferably connected, to the node 312 and another terminal of the switch 308 is coupled, preferably connected, to a node 314. One conduction terminal, for example, the drain, of the transistor 310 is coupled, preferably connected, to the node 314 and another conduction terminal, for example, the source, of the transistor 310 is coupled, preferably connected, to the node 5.

Thus, the set comprising the resistor 302 and the transistor 304 is in parallel with the set comprising the switches 306, 308 and the transistor 310.

Preferably, the transistors 304 and 310 are of the same type, for example N-channel MOS transistors. For example, the transistors 304 and 310 are identical. The control terminals of the transistors 304 and 310 are coupled, preferably connected, to each other.

The circuit 174 further comprises an operational amplifier 316. The operational amplifier 316 receives on one input the voltage Vout and on another input the voltage on the node 303. In other words, the operational amplifier 316 comprises one input coupled, preferably connected, to the node 2 (FIG.

1) and another input coupled, preferably connected, to the node 303. The operational amplifier supplies on output the control signal for the transistors 304 and 310. Thus, the operational amplifier comprises an output coupled, preferably connected, to the control terminals of the transistors 304 and 310.

The circuit 174 further comprises a capacitor, or capacitive circuit with variable capacitance. That is, the circuit 174 includes at least two capacitors connected between the nodes 312 and 5. More specifically, the circuit 174 comprises a transistor 318 connected between the nodes 312 and 5. One terminal of the capacitor 318 is coupled, preferably connected, to the node 312 and another terminal of the capacitor 318 is coupled, preferably connected, to the node 5. Thus, the capacitor 318 is charged whenever the circuit 174 generates a voltage ramp.

The circuit 174 comprises at least one set 320. Each set 320 comprises a capacitor 322 and a switch 324 connected in series between the nodes 312 and 5. More specifically, in each set 320, one terminal of capacitor 322 is coupled, preferably connected, to the node 5 and another terminal of the capacitor is coupled, preferably connected, to one terminal of the switch 324, with the other terminal of the switch 324 being coupled, preferably connected, to the node 312. Preferably, the capacitors 322 are identical to each other and identical to the capacitor 318.

When generating the voltage ramp RAMP2, the switch 306 is in an on state and the switch 308 is in an off state, so as to charge the capacitor 318 and the capacitors 322 of the set whose switch 324 is in an on state. The overall capacitance value of the charged capacitors determines the slope of the voltage ramp RAMP2. Thus, the greater the number of switches in an on state, the greater the overall capacitance, and the lower the slope of the ramp RAMP2.

The states of the switches 324 are determined by the TRIM signal. Thus, the TRIM signal determines the number of switches in an off state (open) and the number in an on state (closed). Thus, the TRIM signal determines the slope of the ramp RAMP2. For example, if the value of the TRIM signal increases, the number of open switches 324 increases, or conversely, as the value of the TRIM signal increases, the number of open switches 324 decreases. For example, if the TRIM signal value increases by one step, for example 1, a switch 324 is open and if the TRIM signal value decreases by one step, for example 1, a switch 324 is closed. Preferably, only one switch 324 may be closed or open from one cycle to the next. Preferably, when the converter 1 is started, one half of the switches 324 are open and the other half of the switches are closed.

For example, the circuit 174 comprises a circuit, not represented, configured to convert the TRIM signal, into a binary word, comprising for example one bit for each switch 324.

Alternatively, the capacitor 318 may be replaced with a set 320.

Figure 7:
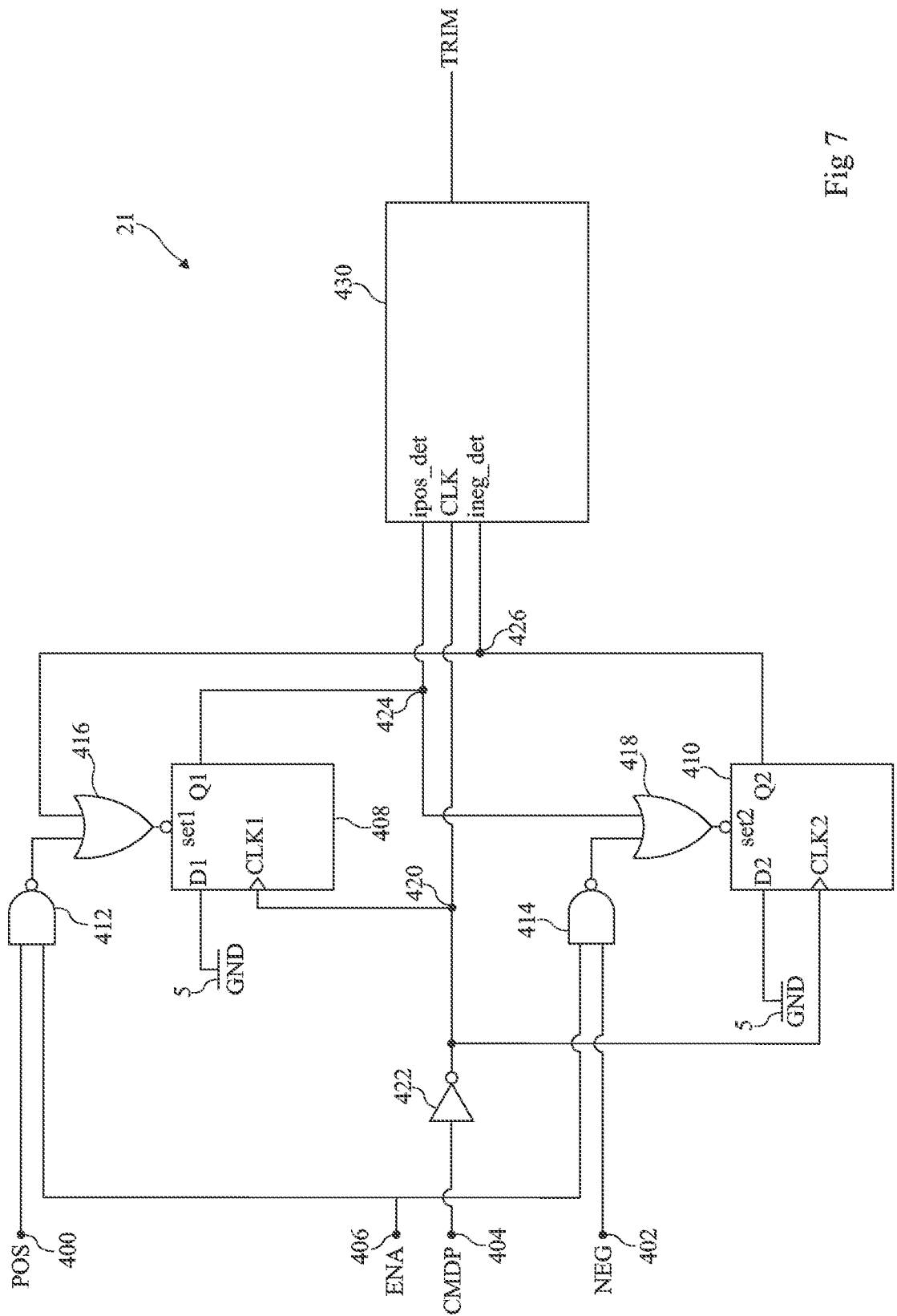
FIG. 7 represents in more detail a portion of the embodiment of FIG. 1.

FIG. 7 represents in greater detail a portion of the embodiment of FIG. 1. More specifically, FIG. 7 represents an example of the implementation of the circuit 21.

The circuit 21 receives at inputs 400 and 402 respectively the POS and NEG signals. The circuit 21 additionally receives the CMDP signal at an input 404. The circuit 21 further receives an ENA signal at an input 406. The ENA signal is a binary start-up signal for the converter 1. In other words, when the ENA signal is at a first binary value, preferably the value 0, the converter is in an off state, and when the ENA signal has a second binary value, preferably the value 1, the converter 1 is in an on state. Thus, during the operation of the circuit 21, the ENA signal has a constant value equal to 1.

The circuit 21 comprises two D flip-flops 408 and 410. The circuit 21 further comprises two NAND logic gates 412 and 414, and two OR logic gates 416 and 418.

The flip-flop 408 comprises a data input D1 at which the reference voltage GND is provided. In other words, the D1 input of the flip-flop 408 is coupled, preferably connected, to the node 5. In other words, the D1 input receives, consistently during the operation of the circuit 21, as an input, the binary value 0.

The flip-flop 408 comprises a clock input CLK1. The CLK1 input is coupled, preferably connected, to a node 420 on which the complementary signal of the CMDP control signal is provided. Thus, the node 404 is connected to node 420 by an inverter circuit 422. An input of the circuit 422 is coupled, preferably connected, to the node 404 and an output of the circuit 422 is coupled, preferably connected, to the node 420.

The flip-flop 408 comprises an output Q1 coupled, preferably connected, to a node 424.

Similarly, the flip-flop 410 comprises a data input D2 at which the reference voltage GND is provided. In other words, the D2 input of the flip-flop 410 is coupled, preferably connected, to the node 5. In other words, the D2 input receives, consistently during the operation of the circuit 21, as an input the binary value 0.

The flip-flop 410 comprises a clock input CLK2. The CLK2 input is coupled, preferably connected, to the node 420 on which the complementary signal of the CMDP control signal is provided.

The flip-flop 410 comprises an output Q2 coupled, preferably connected, to a node 426.

The flip-flops 408 and 410 further comprise set1 and set2 active inputs which are set to 1 and zero respectively, i.e., the Q1 or Q2 output is set to 1 if the signal on the respective input is zero. The set1 input is coupled, preferably connected, to an output of the OR gate 416. One input of the gate 416 is coupled, preferably connected, to the node 426 and another input of the OR gate 416 is coupled, preferably connected, to an output of the NOT AND gate 412. One input of the NOT AND gate 412 is coupled, preferably connected, to the node 400 and another input of the NOT AND gate 412 is coupled, preferably connected, to the node 406.

The set2 input is coupled, preferably connected, to an output of the OR gate 418. One input of the gate 418 is coupled, preferably connected, to node 424 and another input of the OR gate 418 is coupled, preferably connected, to an output of the NOT AND gate 414. One input of the NOT AND gate 414 is coupled, preferably connected, to the node 402 and another input of the NOT AND gate 414 is coupled, preferably connected, to the node 406.

Thus, at each rising edge of the CMDP signal, i.e., at the beginning of each energy accumulation phase, i.e., at the end of each cycle:

the binary value on the node 424, i.e., an ipos_det signal, assumes the value of 1 if the POS signal has the value of 1, the ENA signal has the value of 1, and if the binary value on the node 426 is equal to 0, i.e., if the circuit 19 determines that the current in the inductor 15 is positive, if the circuit 21 is operating, and if the circuit 19 has not determined that the current in the inductor is negative.

the binary value at the node 424, i.e., an ipos_det signal, assumes the value 0 if the POS signal or the ENA signal is 0, or if the binary value at the node 426 is 1, i.e., if the circuit 19 does not determine that the current in the inductor 15 is positive, or if the circuit 21 is not operating or if the circuit 19 determines that the current in the inductor is negative the binary value at the node 426, i.e., an ineg_det signal, assumes the value of 1 if the NEG signal has the value of 1, the ENA signal has the value of 1, and the binary value at the node 424 is 0, i.e., if the circuit 19 determines that the current in the inductor 15 is negative, if the circuit 21 is operating, and if the circuit 19 has not determined that the current in the inductor is positive; and the binary value at node 426, i.e., an ineg_det signal, takes on the value 0 if the NEG signal or the ENA signal is 0, or if the binary value at the node 424 is 1, i.e., if the circuit 19 does not determine that the current in the inductor 15 is negative, or if the circuit 21 is not operating or if the circuit 19 determines that the current in the inductor is positive.

Preferably, the ipos_det and ineg_det signals cannot be equal to 1 at the same instant. If the ipos_det and ineg_det signals are equal to 1 at the same instant, this information is ignored by the circuit 430. If the POS signal is set to 1 when the ineg_det signal is already set to 1, an input of the OR gate 416 is already set to 1, so setting the POS signal to 1 does not change the output value of 416 and the ipos_det signal cannot be set to 1. Similarly, if the NEG signal is set to 1 when the ipos_det signal is already set to 1, an input of the OR gate 418 is already set to 1 and therefore setting the NEG signal to 1 does not change the output value of 418 and the ineg_det signal cannot change to 1.

The circuit 21 further comprises a circuit 430. The circuit 430 receives as input the ipos_det, ineg_det signals. In other words, the circuit 430 comprises an input coupled, preferably connected, to the node 424 and an input coupled, preferably connected, to the node 426. In addition, the circuit 430 comprises a clock input CLK at which the circuit 430 receives the complementary signal of the CMDP signal. In other words, the CLK input of the circuit 430 is coupled, preferably connected, to the node 420. The circuit 430 further comprises an output on which the TRIM signal is provided. The TRIM signal is, for example, provided on a multi-bit data bus, such as a 5-bit data bus.

The circuit 430 is configured to change the value of the TRIM signal according to the values of the ipos_det and ineg_det signals. For example, the circuit 430 is a counter configured to, at each falling edge of the complementary signal of the CMDP signal, i.e., at each rising edge of the CMDP signal, i.e., at the beginning of each cycle, decrease the value of the TRIM signal by one step, preferably by 1, if the ipos_det signal has the value of 1 and increase the value of the TRIM signal if the ineg_det signal has the value of 1. Preferably, if the TRIM signal value reaches the minimum value, for example 0, and the ipos_det signal has the value 1, the TRIM signal value is not changed. Similarly, if the TRIM signal value reaches the maximum value, and the ineg_det signal has the value 1, the TRIM signal value is not changed. Furthermore, if the ipos_det and ineg_det signals are simultaneously 1, the TRIM signal value is not changed.

More generally, the circuit 21 is configured to detect at a given instant, for example the beginning of a cycle corresponding for example to a rising edge of the control signal of the transistor 9, the state of the POS and NEG signals so as to modify the TRIM signal. This is done by means of D flip-flops, and in particular by supplying the POS and NEG signals, set to 1, to the asynchronous (SET) inputs of the flip-flops, the flip-flops being reset to 0 on the falling edge of the CMDP signal of each cycle.

Preferably, the device 1 is configured so that a rising edge of the CMDP signal does not occur at the same time that the POS and NEG signals have a high value, i.e., a value of 1.

An advantage of the described embodiments is that it allows a current through the inductor to be zero at the end of the cycle.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

What is claimed is:

1. A voltage converter configured to operate by a succession of operating cycles, each cycle comprising a plurality of phases, wherein the converter is configured to:
    determine a slope parameter for a slope of a voltage ramp according to a sign of a current in an inductor at an end of a previous operating cycle;
    generate the voltage ramp, wherein the voltage ramp has a slope corresponding with the determined slope parameter;
    generate a comparison result by comparing a voltage of the voltage ramp with a first reference voltage; and
    in response to the comparison result, end one of the phases, wherein a duration of the one of the phases is based on the slope of the voltage ramp,
    wherein the converter comprises:
        a first transistor and a second transistor connected in series between a first node for applying a supply voltage and a second node for applying a second reference voltage, wherein the first and second transistors are connected to each other by a third node, wherein the third node is connected to a fourth output node by the inductor, and wherein the fourth output node is connected to the second node by a first capacitor, and
        a first circuit connected to the third node, the first circuit configured to determine the sign of the current through the inductor, wherein the first circuit comprises a third transistor and a fourth transistor connected in series between a fifth node and a sixth node, wherein the third and fourth transistors are connected to each other by a seventh node connected to the third node, wherein the fifth node is connected to the first node by a first resistor and the sixth node is connected to the second node by a second resistor, wherein a control terminal of the third transistor is connected to the second node, wherein a control terminal of the fourth transistor is connected to the first node.

2. The converter according to claim 1, wherein the one of the phases is an energy restitution phase.

3. The converter according to claim 2, wherein the converter is configured to:
    increase, from one cycle to a next cycle, the slope of the voltage ramp when the current in the inductor is negative, and
    lower, from the one cycle to the next cycle, the slope of the voltage ramp when the current in the inductor is positive.

4. The converter according to claim 1,
further comprising a second circuit, wherein the second circuit comprises:
an eighth output node configured to provide a first signal that takes a first value when a voltage at the third node is greater than a first supply voltage and a second value when the voltage at the third node is less than the first supply voltage, and
a ninth output node configured to provide a second signal that takes the first value when the voltage at the third node is less than a second supply voltage and the second value when the voltage at the third node is greater than the second supply voltage.

5. The converter according to claim 1, further comprising a second circuit configured to generate the voltage ramp, the slope of the voltage ramp depending on a third signal.

6. The converter according to claim 5, wherein the second circuit comprises a circuit of variable capacitance configured to be charged when the voltage ramp is generated, and wherein a capacitance of the circuit depends on a value of the third signal.

7. The converter according to claim 6, wherein the third signal has a plurality of possible signal values, each signal value corresponding to a capacitance value.

8. The converter according to claim 5, wherein the converter comprises a third circuit configured to determine a change in the third signal according to values of a first signal and a second signal.

9. A method for controlling a voltage converter comprising a succession of operating cycles, each cycle comprising a plurality of phases, the method comprising:
by the converter, determining a slope parameter for a slope of a voltage ramp according to a sign of a current in an inductor at an end of a previous operating cycle;
by the converter, generating the voltage ramp, wherein the voltage ramp has a slope corresponding with the determined slope parameter;
by the converter, generating a comparison result by comparing a voltage of the voltage ramp with a first reference voltage; and
by the converter, in response to the comparison result, ending one of the phases, wherein a duration of the one of the phases is based on the slope of the voltage ramp
wherein the converter comprises:
a first transistor and a second transistor connected in series between a first node for applying a supply voltage and a second node for applying a second reference voltage, wherein the first and second transistors are connected to each other by a third node, wherein the third node is connected to a fourth output node by the inductor, and wherein the fourth output node is connected to the second node by a first capacitor, and
a first circuit connected to the third node, wherein the first circuit is configured to determine the sign of the current through the inductor, wherein the first circuit comprises a third transistor and a fourth transistor connected in series between a fifth node and a sixth node, wherein the third and fourth transistors are connected to each other by a seventh node connected to the third node, wherein the fifth node is connected to the first node by a first resistor and the sixth node is connected to the second node by a second resistor, wherein a control terminal of the third transistor is connected to the second node, wherein a control terminal of the fourth transistor is connected to the first node.

10. The method according to claim 9, wherein the one of the phases is an energy restitution phase.

11. The method according to claim 10, further comprising:
increasing, by the converter, from one cycle to a next cycle, the slope of the voltage ramp when the current in the inductor is negative, and
lowering, by the converter, from the one cycle to the next cycle, the slope of the voltage ramp when the current in the inductor is positive.

12. The method according to claim 9, wherein the method comprises: providing, by an eighth output node of a second circuit, a first signal that takes a first value when a voltage at the third node is greater than a first supply voltage and a second value when the voltage at the third node is less than the first supply voltage; and providing, by a ninth output node of the second circuit, a second signal that takes the first value when the voltage at the third node is less than a second supply voltage and the second value when the voltage at the third node is greater than the second supply voltage.

13. The method according to claim 9, wherein the converter further comprises a second circuit, and wherein the method further comprises:
generating, by the second circuit, the voltage ramp, wherein the slope of the voltage ramp depends on a third signal.

14. The method according to claim 13, wherein the second circuit comprises a circuit of variable capacitance, and wherein the method further comprises:
charging the circuit of variable capacitance when the voltage ramp is generated,
wherein a capacitance of the circuit of variable capacitance depends on a value of the third signal.

15. The method according to claim 14, wherein the third signal has a plurality of possible signal values, each signal value corresponding to a capacitance value.

16. The method according to claim 13, wherein the converter comprises a third circuit, and wherein the method further comprises:
determine a change in the third signal according to values of a first signal and a second signal.

* * * * *